United States Patent [19]

Knauer

[11] 3,987,393
[45] Oct. 19, 1976

[54] LINE VOLTAGE MONITOR

[75] Inventor: Paul Knauer, Menomonee Falls, Wis.

[73] Assignee: Litton Industrial Products, Inc., Milwaukee, Wis.

[22] Filed: Nov. 29, 1974

[21] Appl. No.: 528,190

Related U.S. Application Data

[63] Continuation of Ser. No. 154,123, June 17, 1971, abandoned.

[52] U.S. Cl. ............................ 324/102; 324/103 P; 324/133
[51] Int. Cl.² ................... G01R 19/00; G01R 19/14
[58] Field of Search ............ 324/102, 103 R, 103 P, 324/133; 317/36 TD

[56] References Cited
UNITED STATES PATENTS
3,774,109  11/1973  Janycky ............................ 324/102

Primary Examiner—R. V. Rolinec
Assistant Examiner—Ernest F. Karlsen
Attorney, Agent, or Firm—Daniel D. Fetterley; Donald J. Ellingsberg

[57] ABSTRACT

A line voltage monitor for monitoring the voltage applied to electrical equipment and for providing an indication or protective disablement of the equipment in the event excessive variations occur in the line voltage. The line voltage monitor includes a steady state voltage sensing means and a transient voltage sensing means for detecting both types of voltage variations.

8 Claims, 1 Drawing Figure

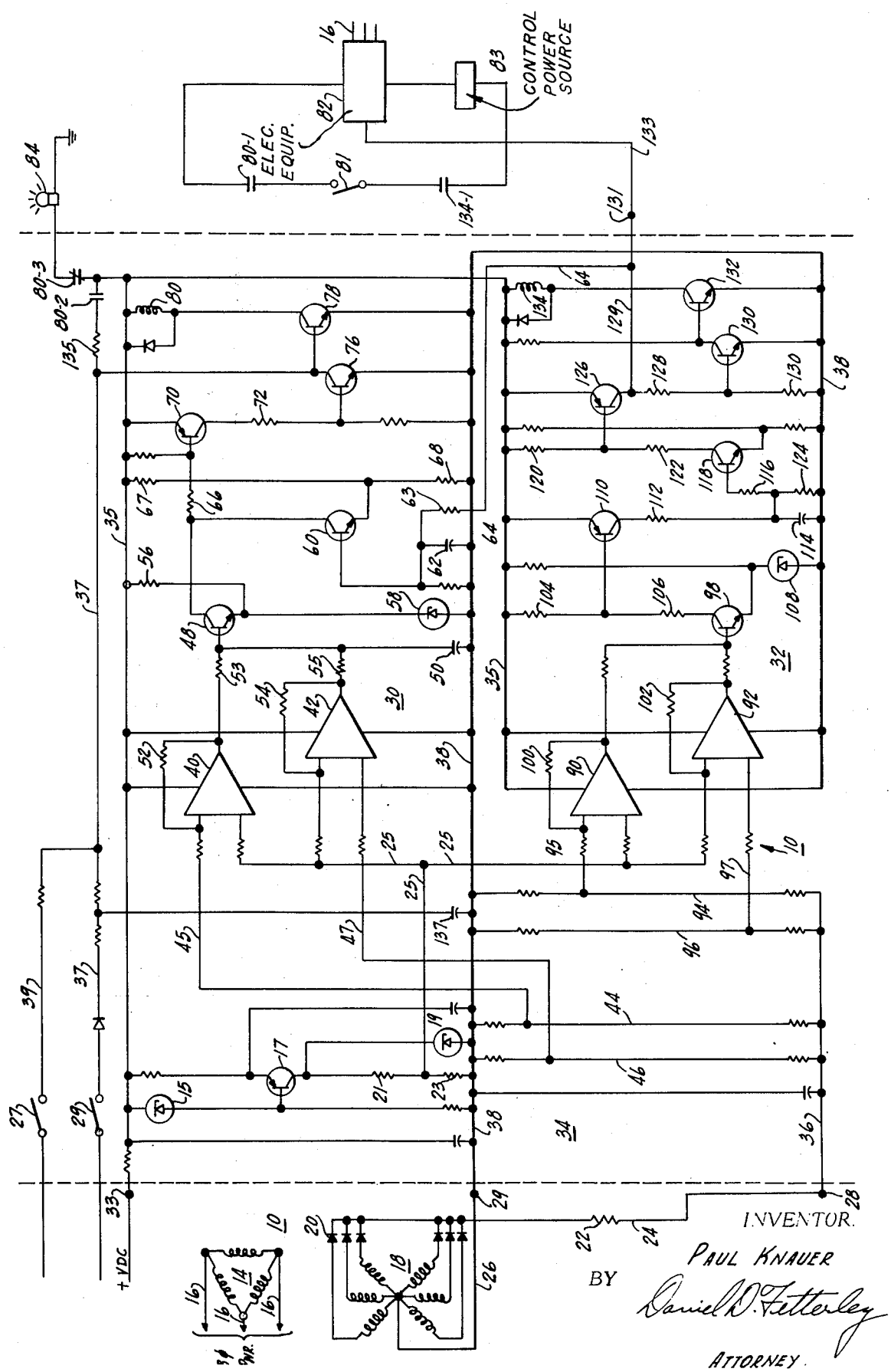

LINE VOLTAGE MONITOR

This is a continuation, of application Ser. No. 154,123, filed June 17, 1971.

BACKGROUND OF THE INVENTION

1. Field of the Invention

The present invention relates to circuitry for monitoring a line voltage and for detecting abnormal conditions therein.

BACKGROUND OF THE INVENTION

2. Description of the Prior Art

Most electrical circuitry is designed to operate at a relatively fixed power supply voltage. When the power supply voltage increases above, or decreases below, the fixed level malfunction or damage of the electrical circuitry is to be expected. Such impairment may occur responsive to either steady state or transient voltage variations and, particularly in the latter instance, the source of the malfunction or damage is not subsequently readily apparent.

Power supply voltage variations may arise from several causes. The application or removal of large electrical loads to or from the power supply lines causes variations in the power supply voltage. Power interruption or loss may arise from storms, equipment failure, and the like. Deliberate voltage reductions by utility power generating stations, as a power saving measure, are becoming more prevalent.

As the capacity of the power generating equipment becomes smaller, voltage control becomes more difficult and voltage variations over a wider range are encountered. Typical of such smaller power capacity systems are those found in self-contained power plants, for example, remote station or ship board systems.

The aforesaid power supply voltage variations necessitate the following protective measures. First, the electrical circuitry is designed to operate satisfactorily in spite of minor voltage variations. For example, a common specification for shipboard electrical equipment requires that the equipment operate satisfactorily with transient voltage variations of ± 18% and steady state voltage variations of ± 5% for up to 2 seconds. Second, apparatus is provided which monitors the power supply or line voltage. When voltage variations in excess of the specified range are detected, the apparatus disables the electrical circuitry as a protective measure. Other safety sequences may be initiated. For example, in the event of a power failure, data stored in a computer memory may be transferred to tape. The line voltage monitor may also provide a visual or audio indication to an operator so that he may attend to the power generating equipment or electrical circuitry. In both cases, the monitoring apparatus points to line voltage variations as the cause of equipment damage or malfunction.

SUMMARY OF THE PRESENT INVENTION

The present invention is directed to a line voltage monitor which is capable of monitoring a power supply voltage and of providing an output condition indicative of out of range power supply voltage conditions. The line voltage monitor may be connected to electrical circuitry for rapidly initiating protective measures, such as disabling the equipment, if the power supply voltage exceeds the range which the equipment can tolerate.

If the disabling of the equipment is due to out of range steady state voltage variations, the line voltage monitor of the present invention prevents the resupply of power supply voltage except by overt action on the part of the operator, presumably after he has remedied the condition causing the out of range steady state voltage variation. In the case of transiently out of range voltage conditions, the line voltage monitor of the present invention operates to disable the electrical equipment for a predetermined period, during which a transient condition is dissipated and after which resumption of power supply automatically is obtained. However, if the transiently out of range condition persists, the line voltage monitor permanently disables the electrical circuitry until the operator restores the operation of the equipment.

The line voltage monitor of the present invention is simple and economical in construction and operation and is capable of substantially trouble free service for substantial periods of time.

Briefly, the line voltage monitor of the present invention includes input means connectable to the line voltage to be monitored and output terminal means for providing an output condition indicative of out of range conditions in the monitored line voltage. Interposed between the input and output terminal means is a steady state voltage responsive means for detecting steady state voltage variations in excess of a predetermined range and for providing a corresponding output signal condition. A transient voltage responsive means is also connected between the input and output terminal means for detecting out of range transient voltage variations and for providing a corresponding output condition.

The steady state voltage responsive means includes a timer which provides the indicative output condition only after the excessive steady state voltage condition has existed for a period of time. The transient voltage responsive means provides the indicative output condition for a predetermined protective interval only. However, the transient voltage responsive means and the steady state voltage responsive means are interconnected so that if the transiently excessive condition persists the steady state voltage responsive means is operated to provide the indicative output condition.

BRIEF DESCRIPTION OF THE DRAWING

The sole FIGURE is a schematic diagram of the line voltage monitor of the present invention.

DESCRIPTION OF THE PREFERRED EMBODIMENT

Turning now to the sole FIGURE, there is shown therein line voltage monitor 10 of the present invention. In a typical embodiment, line voltage monitor 10 is designed to monitor an alternating current line voltage and to provide an indication and/or circuitry disablement in the event of out of range steady state or transient voltage variations. For example, steady state voltage variations in excess of ± 5% existing for a period of 2 seconds will operate line voltage monitor 10.

Transient voltage variations of ± 18% of the steady state value will also operate line voltage monitor 10. Thus, the maximum voltage variation permitted is ± 23% i.e. a 5% steady state variation plus an 18% transient variation of the steady state voltage. In the event of an excessive transient voltage variation, disablement of the electric circuitry occurs within a ½ cycle of the line voltage. If the transiently out of range voltage condition has ceased during a protective period for example, 250 milliseconds, a restoration of power is automatically made to the electrical circuitry. However, if the transiently excessive voltage condition exists for more than one second, the power may be restored only by the operator.

The line voltage to be monitored is provided to transformer 12 having delta wound primary winding 14 connected to the three phase alternating current voltage lines 16. The ends of a wye connected secondary winding 18 are connected to the anodes of diodes 20, the cathodes of which are connected in common to resistor 22 and conductor 24. The neutral of wye connected secondary winding 18 is connected to conductor 26. Conductors 24 and 26 are connected to input terminals 28 and 29 of voltage monitor 10.

Input terminals 28 and 29 form a portion of input section 34 of line voltage monitor 10. Input terminal 28 is connected to conductor 36 to provide the line voltage signal thereto. A circuit common conductor 38 is connected to input terminal 29 and the neutral of transformer 12. Input section 34 also includes a reference circuit for developing a reference signal from a voltage supplied to bus 35 at terminal 33. The reference circuit includes zener diode 15, transistor 17, zener diode 19, and a voltage divider comprised of resistors 21 and 23. The reference signal is provided in conductor 25.

Input section 34 includes switches 27 and 29 which provide a sequencing signal in conductor 37 and a reset signal in conductor 39, respectively. Capacitor 137 is connected between conductor 37 and circuit common conductor 38. The sequencing signal is used to coordinate the operation of line voltage monitor 10 with the operation of the electrical circuitry to be protected. The reset signal resets line voltage monitor 10 after detection of an out of range voltage variation and disablement of the electrical circuitry.

Line voltage monitor 10 includes two line voltage responsive sections 30 and 32. Voltage responsive section 30 is designed to detect line voltage variations in excess of ± 5% while voltage responsive section 32 is designed to detect line voltage variations in excess of ± 23%.

Voltage responsive section 30 includes two voltage level detectors 40 and 42. Level detector 40 is designed to sense a 5% over voltage condition while level detector 42 is designed to sense a 5% under voltage condition. Any commonly available sensing circuit may be used as level detectors 40 and 42, differential amplifiers being shown in the sole FIGURE. The reference signal in conductor 25 is provided to one of the inputs of the differential amplifiers. The line voltage to be monitored is provided to the other input of the differential amplifiers. For this purpose, a pair of resistive voltage dividers 44 and 46 are placed between line voltage signal conductor 36 and circuit common conductor 38 and signals taken from the center of the voltage dividers in conductors 45 and 47. The values of the resistances in the voltage dividers are sized so that the signals in conductors 45 and 47 are commensurate with the voltage variation to be sensed by voltage level detectors 40 and 42. The values of the resistance may be changed if it is desired to alter the detection level of the detectors. It will be appreciated that other types of sensing circuits, such as a Schmitt trigger may be used as the voltage level detectors.

The outputs of level detectors 40 and 42 are connected in parallel, through resistors 53 and 55, to the base of transistor 48 and to capacitor 50. Resistive feedback paths 52 and 54 are provided between the input and output of level detectors 40 and 42, respectively, for stabilization purposes.

Transistor 48 is biased by resistor 56 and diode 58. The emitter-collector circuit of tansistor 48 is connected in parallel with the emitter-collector circuit of transistor 60. The base of transistor 60 is connected to capacitor 62 which is charged by the signal in conductor 64 through resistor 63, in a manner hereinafter described. The emitter-collector circuit of transistor 60 is biased by resistor 66, 67 and 68.

The collectors of transistors 48 and 60 are connected to the base of transistor 70. The emitter-collector circuit of transistor 70 is connected across conductors 35 and 38. The collector of transistor 70 is connected, through resistor 72, to the base of transistor 76, the emitter-collector circuit of which is connected between conductor 37 and conductor 38. The collector of transistor 76 is connected to the base of transistor 78. The coil 80 of a relay is connected in series with the collector of transistor 78 and conductor 35. The emitter of transistor 78 is connected to conductor 38.

A pair of normally open relay contacts 80-1 operable by relay coil 80, are connected in series with the electrical equipment on-off switch 81 and the electrical equipment 82, itself. The line voltage applied to electrical equipment 82 in power lines 16 is monitored by line voltage monitor 10. The above mentioned elements are connected in series with a control power source 83 for electrical equipment 82 and a second pair or normally open relay contacts, hereinafter described.

Normally open relay contacts 80-2 are interposed between conductor 37 and conductor 35 and in series with resistor 135. Normally closed relay contacts 80-3 are connected in series with conductor 35 and indicator light 84.

Voltage responsive section 32 includes two level detectors 90 and 92. Level detector 90 is designed to sense a 23% over voltage condition while level detector 92 is designed to sense a 23% under voltage condition. Level detectors 90 and 92 may be similar or identical to level detectors 40 and 42 but biased to detect the different voltage level. The reference signal in conductor 25 is provided to one of the inputs of the differential amplifiers forming level detectors 90 and 92. Resistive voltage dividers 94 and 96 provide a line voltage signal to the other inputs of the differential amplifiers in conductors 95 and 97. The value of the resistors in the voltage dividers are sized so that the signal in conductors 95 and 97 are commensurate with the voltage variations to be sensed.

The outputs of level detectors 90 and 92 are connected in parallel to the base of transistor 98. Resistive feedback paths 100 and 102 are provided between the input and output of level detectors 90 and 92, respectively, for stabilization purposes.

Transistor 98 is biased by resistors 104 and 106 and diode 108. The collector of transistor 98 is connected to the base of transistor 110 through resistor 106. The emitter-collector circuit of tansistor 110 is connected across conductors 35 and 38 and in series with resistor 112 and capacitor 114. The collector of transistor 110 is connected, through resistors 112 and 116 to the base of transistor 118, the emitter-collector circuit of which is connected between conductor 35 and conductor 38 and in series with resistors 120, 122, and 124. The collector of transistor 118 is connected to the base of transistor 126 through resistor 122. The emitter-collector circuit of resistor 126 is connected between conductors 35 and 38 and in series with resistors 128 and 130.

The signal at the collector of transistor 126 is provided in conductor 129 to output terminal 131. The signal in conductor 129 is also provided to conductor 64 and capacitor 62 of voltage responsive section 30. The collector of transistor 126 is connected through resistor 128 to the base of transistor 130. The collector of tansistor 130 is connected to the base of transistor 132. The coil 134 of a relay is connected in series with the collector of transistor 132 and conductor 35. The emitter of transistor 132 is connected to conductor 38. Normally open relay contacts 134-1 operable by relay coil 134, are connected in series with relay contacts 80-1 and on-off switch 81 of electronic circuitry 82.

In operation, the line voltage to be monitored is provided to the inputs of level detectors 40, 42, 90 and 92, in conductors 45, 47, 95, and 97, respectively. If the line voltage is within the established limits, there will be no output signals from the level detectors. In voltage responsive section 30, transistors 48, 70, and 72 are biased off. A sequencing signal in conductor 37 provided by switch 29 charges up capacitor 137 which in turn discharges into the base-emitter junction of transistor 78 to turn transistor 78 on, energizing relay coil 80. The energization of relay coil 80 closes relay contacts 80-1 and opens relay contacts 80-3. The energization of relay 80 also closes relay contacts 80-2 which applies a bias on the base of tansistor 78 through resistor 135 when the sequencing signal is removed. Relay contacts 80-3 are open, deenergizing indicator lamp 84, indicating that the line voltage is within the established limits.

In voltage responsive section 32, with the line voltage within the established levels, there will be no output signals from level detectors 90 and 92. Transistors 98, 110, 118, 126, and 130 are biased off. Transistor 132 is biased on by the signal applied to its base terminal by conductor 35 through resistor 133. Relay coil 134 is energized, closing relay contacts 134-1. The closure of relay contacts 80-1 and 134-1 permits the closure of on-off switch 81 to energize electrical circuitry 82.

Should the line voltage vary more than ± 5% of the steady state value, level detector 40 or 42 will provide an output signal. This output signal charges capacitor 50 through resistor 53 or resistor 55 with a time constant of approximately 2 seconds. After 2 seconds, the voltage across capacitor 50 is sufficient to cause transistor 48 to turn on. Collector current from transistor 48 then turns on transistor 70 which, in turn, causes transistor 76 to interupt the base drive to transistor 78. The loss of base drive to transistor 78 renders the emitter-collector circuit of transistor 78 non conductive deenergizing relay coil 80 and opening relay contacts 80-1. This disables electrical circuit 82 preventing damage or malfunction from the out of range line voltage in power lines 16. Relay contacts 80-3 are closed turning on indicator lamp 84.

When the out of range line voltage condition has been corrected, relay coil 80 is reenergized by applying a reset signal in conductors 39 and 37 to the base of transistor 78.

In the event of transient voltage variations in excess of ± 23% of the established value of the line voltage occur, an output signal is provided from level detector 90 or 92. When this occurs, transistor 98 is immediately rendered conductive, turning on transistor 110 and charging capacitor 114 through resistor 112. The time constant of this RC network is approximately 400 micro seconds so that transistors 118 and 126 are turned on almost immediately. The RC network acts as a noise filter and its time constant may be varied to provide a desired filtering action and rapidity of operation. The output of transistor 126 turns on transistor 130 which interupts the base drive to transistor 132. The loss of base drive to transistor 132 renders the emitter-collector circuit of transistor 132 non conductive, deenergizing relay coil 134 and opening relay contacts 134-1. This disables electrical circuitry 82.

Because the line voltage variation sensed by voltage level detection section 32 are transient in nature, it is usually not desired to permanently disable electrical circuitry 82 from power line 16 unless the transiently out of range condition persists. Thus, if the line voltage returns to normal after the transiently excessive condition, transistors 98 and 110 will be turned off. After a predetermined protective period, for example 250 milliseconds, the charge on capacitor 114 has decreased sufficiently to turn off transistors 118, 126, and 130 and turn on transistor 132. This reenergizes relay coil 134, closing relay contacts 134-1 and restoring the operation of electrical circuitry 82. The operation of voltage responsive section 30 is thus such that, as a protective measure, the electrical circuitry 82 will be disabled for at least 250 milliseconds, regardless of the rapidity with which the transiently out of range line voltage condition passes.

In the event it is desired to provide a more rapid indication of the transiently out of range voltage condition that is available through the electro-mechanical operation of relay coil 134 and relay contacts 134-1, the signal in conductor 129 to output terminal 131 may be utilized. Output terminal 131 may be connected by conductor 133 to a solid state, or other non mechanical, switching device in electrical circuitry 82.

During the transiently out of range line voltage condition, the collector voltage of transistor 126 is also applied through conductor 64 and resistor 63 to capacitor 62. The time constant of this RC network is approximately 1 second. Should the period of the transiently out of range line voltage condition exceed 1 second, capacitor 62 will charge to a voltage sufficient to turn on transistor 60. This action turns on transistors 70 and 76 which, in turn, interupt the base drive to transistor 78 deenergizing relay coil 80 and opening relay contacts 80-1 disabling electrical circuitry 82. Because relay coil 80 is deenergized, the operation of electrical circuitry 82 may be restored only by the application of a reset signal in conductor 37, even though the line voltage in power lines 16 returns to the normal level. Thus, for long term transiently excessive voltage conditions, the operation of electrical circuitry 82 can be restored only by a reset signal in conductor 39.

Various modes of carrying out the invention are contemplated as being within the scope of the following claims particularly pointing out and distinctly claiming the subject matter which is regarded as the invention.

I claim:

1. A line voltage monitor comprising:
  a. an input source of line voltage monitored by the line voltage monitor, b. reference signal means generating a selected reference voltage signal,
c. first line voltage responsive means responsive to steady state line voltage variations and to said reference voltage signal, said first line voltage responsive means generating a first output signal when said steady state line voltage variations are out of a first predetermined voltage range for a first predetermined period of time.
d. second line voltage responsive means responsive to transient line voltage variations and to said reference voltage signal including a second and third timing means measuring second and third predetermined periods of time respectively, said second line voltage responsive means generating a second output signal when said transient line voltage variations are out of a second predetermined voltage range for said second predetermined period of time, said second predetermined voltage range is greater than said first predetermined voltage range and said second predetermined period of time is less than said first predetermined period of time, said second line voltage responsive means further generating a third output signal when said transient line voltage variations are out of said second predetermined voltage range for said third predetermined period of time, said third predetermined period of time is greater than said second predetermined period of time and less than said first predetermined period of time,
e. said first and third output signals being adapted to permanently disable electrical circuitry from the line voltage and said second output signal being adapted to temporarily disable the electrical circuitry from the line voltage, and
f. reset means selectively generating a reset signal to enable the electrical circuitry so that the line voltage is resupplied to the electrical circuitry and the line voltage monitor continues to monitor the line voltage.

2. The line voltage monitor of claim 1 in which said first line voltage responsive means includes a first timing means measuring said first predetermined period of time.

3. The line voltage monitor of claim 2 in which said first timing means is a first capacitor.

4. The line voltage monitor of claim 1 in which said second and third timing means are second and third capacitors respectively.

5. The line voltage monitor of claim 1 in which said first predetermined voltage range is ± 5% of the line voltage and said second predetermined voltage range is ± 23% of the line voltage.

6. The line voltage monitor of claim 1 in which said first predetermined period of time is at least 2 seconds, said second predetermined period of time is at least 400 micro seconds, and said third predetermined period of time is at least 1 second.

7. The line voltage monitor of claim 1 in which said temporary disablement of electrical circuitry is for a predetermined protective period of time after which the line voltage is resupplied to the electrical circuitry.

8. The line voltage monitor of claim 7 in which said protective period of time is less than 250 milliseconds.

* * * * *